United States Patent
Matsushima et al.

(10) Patent No.: US 7,827,931 B2
(45) Date of Patent: Nov. 9, 2010

(54) PLASMA PROCESSOR ELECTRODE AND PLASMA PROCESSOR

(75) Inventors: Keiichi Matsushima, Tokyo (JP); Takashi Suzuki, Yamanashi (JP); Hajime Furuya, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/508,699

(22) PCT Filed: Mar. 27, 2003

(86) PCT No.: PCT/JP03/03863

§ 371 (c)(1),
(2), (4) Date: Sep. 29, 2004

(87) PCT Pub. No.: WO03/083922

PCT Pub. Date: Oct. 9, 2003

(65) Prior Publication Data

US 2005/0145336 A1    Jul. 7, 2005

(30) Foreign Application Priority Data

Mar. 29, 2002  (JP) .............................. 2002-098053

(51) Int. Cl.
C23C 16/50    (2006.01)
C23C 16/455   (2006.01)
C23F 1/00     (2006.01)
H01L 21/306   (2006.01)
C23C 16/503   (2006.01)
C23C 16/505   (2006.01)

(52) U.S. Cl. .............................. 118/723 E; 156/345.33; 156/345.34; 156/345.43; 156/345.44

(58) Field of Classification Search ............. 118/723 E, 118/723 ER; 156/345.43–47, 345.33, 345.34
See application file for complete search history.

(56) References Cited

U.S. PATENT DOCUMENTS

| | | | | |
|---|---|---|---|---|
| 3,456,549 A | * | 7/1969 | Horton | 411/427 |
| 4,324,036 A | * | 4/1982 | Reilly | 29/437 |
| 5,766,364 A | * | 6/1998 | Ishida et al. | 118/725 |
| 6,036,782 A | * | 3/2000 | Tanaka et al. | 118/715 |
| 6,700,089 B1 | * | 3/2004 | Hirooka | 219/121.4 |

FOREIGN PATENT DOCUMENTS

| | | |
|---|---|---|
| EP | 202904 | 11/1988 |
| JP | 11-162940 | 6/1999 |

* cited by examiner

Primary Examiner—Rudy Zervigon
(74) Attorney, Agent, or Firm—Oblon, Spivak, McClelland, Maier & Neustadt, L.L.P.

(57) ABSTRACT

A plasma processor electrode includes a support member disposed to face to an electrode that holds a substrate to be treated, an electrode plate fixed to the support member and equipped with gas injection holes and a screw hole open and facing to the support member to supply a processing gas through the gas discharge hole into a processing space formed between the electrode plate and the electrode to generate a plasma in the processing space, and a fastening unit that clamps the electrode plate on the support member by fastening the electrode plate to the support member with a screw driven into the screw hole from the support member.

20 Claims, 10 Drawing Sheets

PLASMA PROCESSOR ELECTRODE AND PLASMA PROCESSOR

FIELD OF THE INVENTION

The present invention relates to a plasma processor electrode and a plasma processor employing the electrode; and, more particularly, to a plasma etching processor electrode and a plasma etching processor for executing an etching process for use in semiconductor substrates, e.g., under plasma atmosphere.

BACKGROUND OF THE INVENTION

Plasma process techniques, including a plasma etching process, a plasma CVD process and the like, have been widely applied in manufacturing semiconductor devices, liquid crystal display devices and the like. A conventional plasma processor employing the plasma process techniques has an upper electrode and a lower electrode so disposed as to face each other in a processing chamber, and causes a processing gas in the processing chamber to become a plasma by applying a high frequency power to the upper electrode, to thereby feed the plasma to a substrate, mounted on the lower electrode, to be processed. Normally, cooling water for cooling the electrode to a desired temperature is supplied to the upper electrode, in addition to the high frequency power and the processing gas.

The upper electrode used in the conventional plasma processor will now be described with reference to FIGS. 8A-8C. As shown in FIG. 8A, the upper electrode 1 includes an electrode plate 2 made of, e.g., quartz with a plurality of gas holes 2A dispersedly formed on the surface thereof, a supporting member 3 made of, e.g., aluminum for supporting the electrode plate 2 and executing a heat exchange with the electrode plate 2, and a shield ring 4, in the form of a circular ring, disposed to blockade peripheral portions of the electrode plate 2 and the supporting member 3.

When the upper electrode 1 is assembled, as shown in FIG. 8B, first of all, a lower surface of the supporting member 3 is made to come in contact with an upper surface of the electrode plate 2, and then both the electrode plate 2 and the supporting member 3 are fixed by using screws 5. Thereafter, in order to avoid an abnormal discharge or contamination of metal, as shown in FIG. 8C, the shield ring 4 is disposed around the electrode plate 2, thereby blocking heads of the screws 5 which are exposed in the processing chamber.

However, as the electrode plate 2 is normally made of quartz, it is not desirable to form tapped holes on the electrode plate 2 due to its high strength, poor workability and the like. Thus in the conventional art, through-holes 2B are normally formed on peripheral portions of the electrode plate 2, and tapped holes are formed on a side of the supporting member 3 made of, e.g., aluminum. Consequently, the electrode plate 2 should be jointed to the supporting member 3 by driving the screws 5 into the tapped holes on the side of the supporting member 3 from a side of the processing chamber (a side of the lower electrode). Furthermore, the screws 5 are required to be isolated from plasma by attaching the shield ring 4 around the electrode plate 2 as described above.

In addition, to avoid abnormal discharge and to execute a desired process, the processing chamber needs to be configured such that surface irregularities are not provided therein as much as possible. For the purpose of it, configuration of the joint portion between the electrode plate 2 and the supporting member 3 become rather complicated, thereby increasing the manufacturing cost thereof. Furthermore, as the through-holes 2B for allowing the screws 5 to pass through are formed on periphery of the electrode plate 2 or an area therearound, there are limitations in that the configuration is further complicated as described above, and the outermost diameter (effective gas hole diameter), i.e., the diameter of the whole circular area where all the gas holes 2A are disposed, cannot be increased.

SUMMARY OF THE INVENTION

It is, therefore, a primary object of the present invention to provide a novel plasma processor electrode and a novel plasma processor capable of increasing the effective gas hole diameter and concealing a joint portion of the electrode plate from plasma completely, and smoothing the surface area which is in contact with the plasma at low costs.

The object is achieved by the novel plasma processor electrode and the plasma processor employing the same, which are described hereinafter. That is, the plasma processor electrode and the plasma processor employing the plasma processor electrode includes: a supporting member arranged to face a supporting electrode for supporting a substrate to be processed; an electrode plate, mounted to the supporting member, including a plurality of gas injection holes and a tapped hole opened toward the supporting member, for providing a processing gas through the gas injection holes into a processing space formed between the electrode plate and the supporting electrode, thereby generating a plasma in the processing space; and a fastening unit for combining the electrode plate with the supporting member by screwing into the tapped hole of the electrode plate from a side of supporting member.

DETAILED DESCRIPTION OF THE PREFERRED EMBODIMENTS

Hereinafter, a plasma processor electrode and a plasma processor in accordance with a first preferred embodiment of the present invention are described in detail with reference to FIGS. 1-7B.

Figure 1:
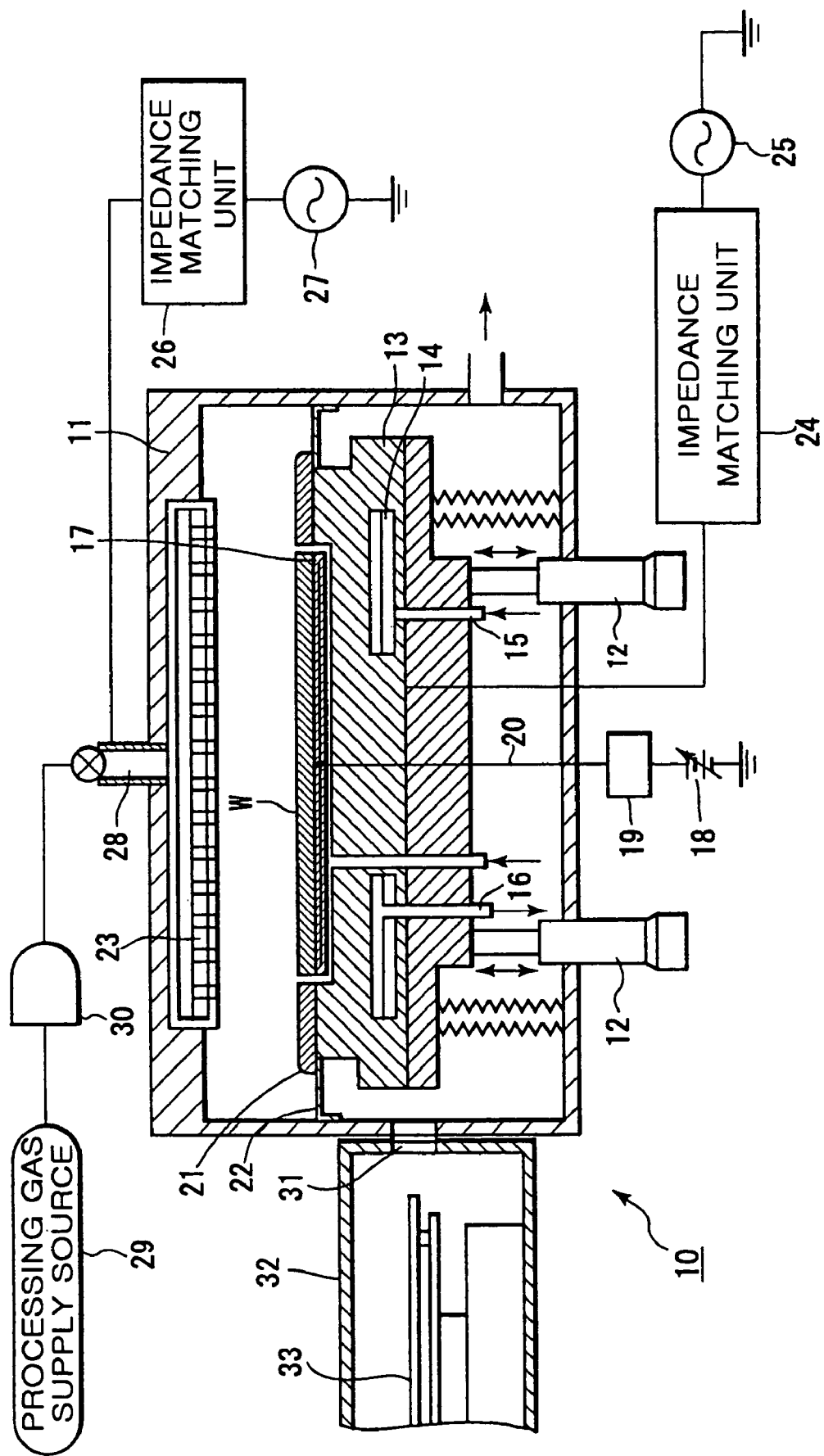
FIG. 1 is a cross sectional view of a plasma processor in accordance with a first preferred embodiment of the present invention.

In accordance with the first preferred embodiment, the plasma processor, e.g., a plasma etching processor 10, includes a processing vessel 11 made of a conductive material such as aluminum, as shown in FIG. 1. A lower electrode 13, vertically movable by elevators 12, such as pneumatic cylinders, is installed in the processing vessel 11. The lower electrode 13 is configured to support a substrate W to be processed by a plurality of members made of, e.g., aluminum. A temperature controlling unit 14, such as a cooling jacket, is installed in the lower electrode 13. The surface temperature of the substrate W, supported on the lower electrode 13, can be controlled to a desired temperature by the temperature controlling unit 14.

The temperature controlling unit 14 includes an inlet line 15 and a discharge line 16 for circulating a refrigerant in the cooling jacket. The refrigerant, which has been controlled to a desired temperature, is supplied into the cooling jacket through the inlet line 15. After a heat exchange, the refrigerant is discharged to an outside through the discharge line 16. Alternatively, a heater, a peltier element or the like, instead of the cooling jacket, can be installed in the lower electrode 13.

An electrostatic chuck 17 for adsorptively holding the substrate W on an upper surface of the lower electrode 13 is mounted. The electrostatic chuck 17 includes a tungsten electrode layer which is interposed between layers made of a sintered or a thermal-sprayed ceramic. By providing a DC high voltage from a variable voltage source 18 to the tungsten electrode layer through a filter 19 and a lead line 20, the substrate W mounted on the lower electrode 13 is electrostatically adsorbed to the ceramic layers.

Moreover, a focus ring 21, having a ring shape, is so arranged as to encircle the substrate W which is adsorbedly supported on the electrostatic chuck 17. The focus ring 21 is selectively made of an insulating or a conductive material according to the type of process, and used to confine or diffuse reactive ions. Furthermore, a gas exhaust ring 22 having a plurality of gas exhaust holes thereon is placed to be lower than the surface of the lower electrode 13 in the lower electrode 13 and the processing vessel 11, thereby encircling the lower electrode 13. By the gas exhaust ring 22, the flow rate of the exhaust gas is controlled, while the plasma is suitably confined between the lower electrode 13 and an upper electrode 23 which will be described hereinafter.

Above the lower electrode 13, the upper electrode 23 is installed to be spaced apart from the lower electrode 13 with a gap of 5 mm-150 mm, such that the lower electrode faces the upper electrode 23. The lower electrode 13, as described above, is vertically movable towards or away from the upper electrode 23. The gap can be freely adjusted by driving the elevators 12 depending on the properties or the composition of the substrate W. Furthermore, a high frequency power supply 25 is connected to the lower electrode 13 through an impedance matching unit 24 including a blocking capacitor. A high frequency power (bias) of about 2 to 13.56 MHz is supplied from the high frequency power supply 25 to the lower electrode 13. A high frequency power supply 27 is connected to the upper electrode 23 through an impedance matching unit 26 including a blocking capacitor. A high frequency power of about 13.56 to 100 MHz is supplied from the high frequency power supply 27 to the upper electrode 23.

A processing gas feeding pipe 28 is connected to the upper electrode 23. A processing gas of, e.g., bromine is supplied from a processing gas supply source 29 into the processing vessel 11 through a flow rate controlling device 30 and the processing gas feeding pipe 28. The processing gas provided into the processing vessel 11 becomes a plasma by the high frequency power source 27, thereby executing an etching process to the substrate W. Moreover, a vacuum preliminary chamber 32 is connected to a side surface of the processing vessel 11 through a gate valve 31, and the substrate W is transferred between the vacuum preliminary chamber 32 and the processing vessel 11 by driving a transfer arm 33 provided in the vacuum preliminary chamber 32.

Hereinafter, the upper electrode 23 in accordance with the first preferred embodiment of the present invention will be described with reference to FIG. 2.

Figure 2:
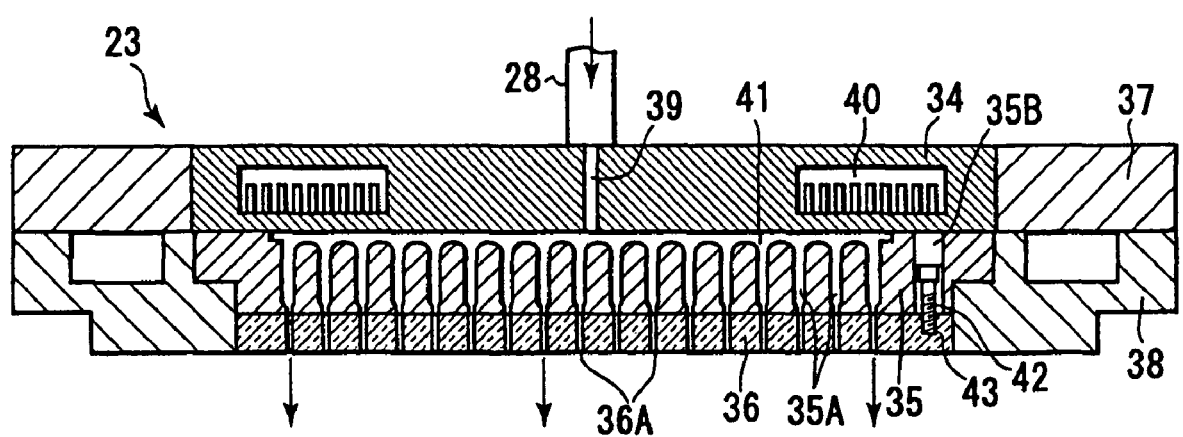
FIG. 2 is a schematic sectional view of an upper electrode of the plasma processor of FIG. 1.

The upper electrode 23 has a laminated structure in which an upper member 34, a cooling plate 35 and an electrode plate 36 are layered in that order from the top as shown in FIG. 2, and ring-shaped insulators 37 and 38 made of, e.g., alumina, are placed between the laminated structure and the processing vessel 11. The upper member 34, including a gas supplying line 39 and a cooling jacket 40 therein, controls the electrode plate 36 to be at a desired temperature through the cooling plate 35. The gas supplying line 39 extends downwards from the gas feeding pipe 28, and the refrigerant circulates in the cooling jacket 40. The gas supplying line 39 communicates with a space 41 formed between a lower surface of the upper member 34 and an upper surface of the cooling plate 35. The processing gas supplied from the gas supplying line 39 is diffused in a horizontal direction in the space 41.

The cooling plate 35, having a disc shape, is made of, e.g., anodic oxidized aluminum. A plurality of gas supplying paths 35A which communicate with a plurality of gas injection holes 36A of the electrode plate 36 are disposed in a vertical direction in the cooling plate 35, as shown in FIG. 2. Thus, the processing gas diffused in the space 41 passes through the gas supplying paths 35A and the gas injection holes 36A in that order, thereby providing the processing gas to the substrate W in the processing vessel 11 uniformly, when the cooling plate 35 and the electrode plate 36 are combined with each other.

Therefore, the electrode plate 36, having a disk shape, is made of, e.g., quartz, and an outer diameter thereof is adjusted to be approximately equal to that of a lower surface of the cooling plate 35. The electrode plate 36 can provide the processing gas uniformly into the processing vessel 11 through the gas injection holes 36A which are dispersedly located on the surface of the electrode plate 36. Moreover, a plurality of through-holes 35B are formed outside of an area, which surrounds all the gas supplying paths 35A on the cooling plate 35, along a peripheral direction. A screw 42 (a fastening unit) made of aluminum, stainless steel or the like is inserted into each of the through-holes 35B. The electrode plate 36 and the cooling plate 35 are firmly joined by screwing the screws 42 into sockets additionally provided in the electrode plate 36. That is, the cooling plate 35 serves as a supporting member for supporting the electrode plate 36.

Figure 3A:
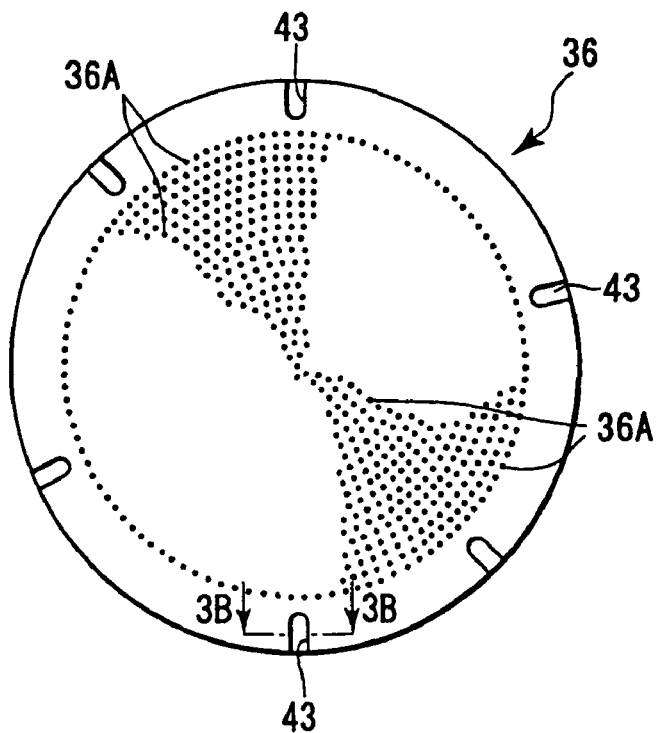
FIG. 3A is a plan view of an electrode plate of the upper electrode of FIG. 2.
Figure 3B:
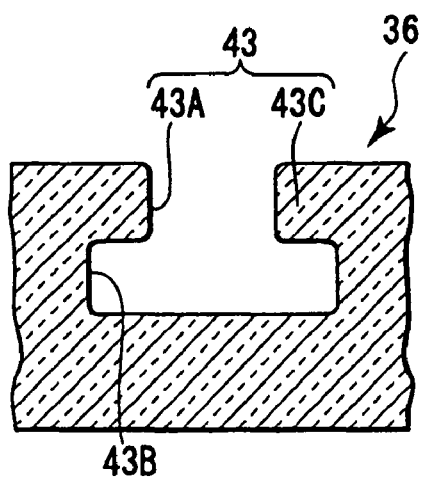
FIG. 3B is a sectional view taken along the line 3B-3B of FIG. 3A.
Figure 4A:
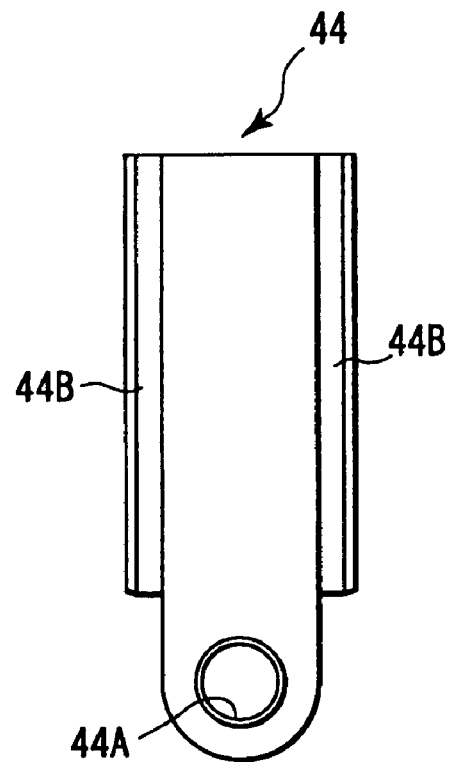
FIG. 4A is a plan view of a socket installed in a receptacle part of the electrode plate of FIG. 3.
Figure 4B:
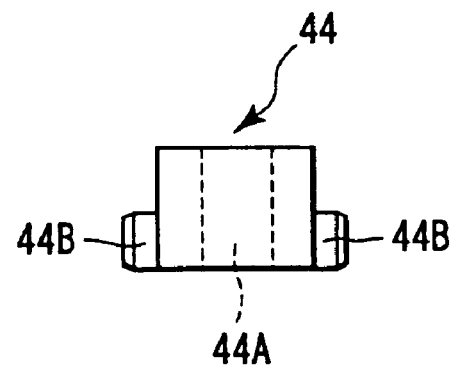
FIG. 4B is a side view of the socket of FIG. 4A.
Figure 9A:
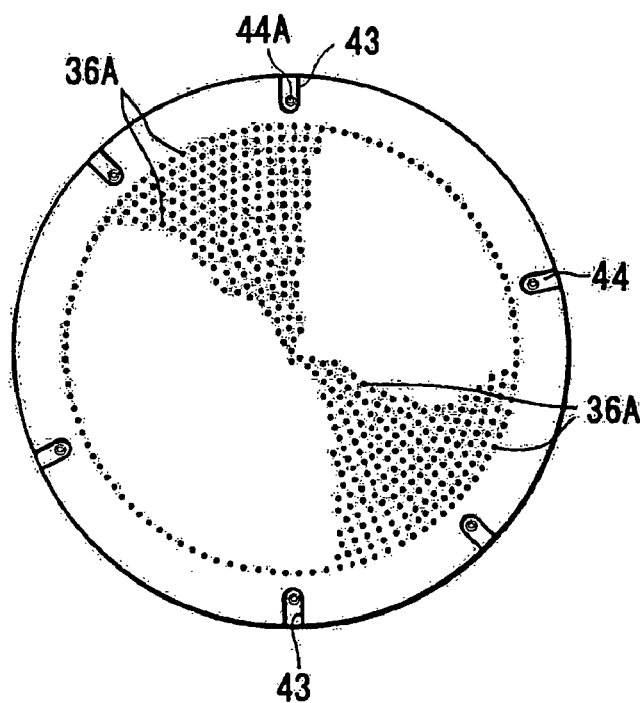
FIG. 9A is a plan view of the electrode plate with the socket shown in FIGS. 4A and 4B installed in the receptacle part of the electrode plate shown in FIGS. 3A and 3B.
Figure 9B:
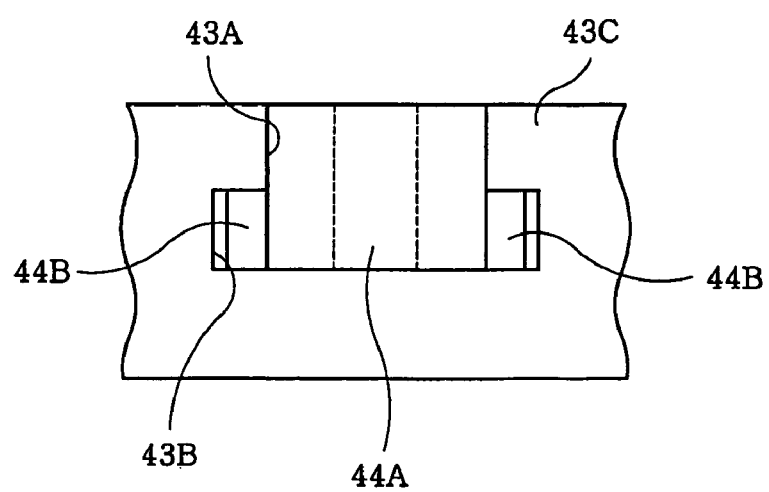
FIG. 9B is a side view of the receptacle part with the socket shown in FIGS. 4A and 4B installed in the receptacle part shown in FIGS. 3A and 3B.

The upper electrode 23 will be described in more detail with reference to FIGS. 3A-4B. As shown in FIG. 3A, a plurality of thin- and long-shaped grooves 43 (receptacle parts) are extended in radial directions from the peripheral portion of the electrode plate 36 to vicinity areas of the gas injection holes 36A (opened toward a circumferential surface of the electrode plate 36). As shown in FIG. 3B, each of the grooves 43 includes an opening 43A and a breadth enlarged part 43B. The opening 43A is opened toward the upper surface of the electrode plate 36 and the breadth enlarged part 43B is widely disposed inside of the opening 43A. A step-attached part 43C is formed at a boundary portion between the opening 43A and the breadth enlarged part 43B. A socket 44 shown in FIGS. 4A and 4B is installed in each of the grooves 43 as shown in FIGS. 9A and 9B.

The socket 44, having a thin and long shape, is made of, e.g., engineering plastic, desirably, polybenzimidazole, such as Cerazole (a product name). As shown in FIG. 4A, the socket 44 includes one end thereof (a lower end in FIG. 4A) having a circular arc shape and the other end thereof (an upper end in FIG. 4A) having a straight-line shape. Moreover, a tapped hole 44A is placed on a side of said one end. Furthermore, as shown in FIGS. 4A and 4B, a flange 44B is located, in a longitudinal direction of the socket 44, at both side surfaces of the socket 44. The socket 44 has a reversed-T front shape. The sockets 44 can be attachably mounted to the electrode plate 36 by inserting/disjointing the socket 44 into/from the grooves 43 of the electrode plate 36. Furthermore, the sockets 44 may be made of aluminum, stainless steel or the like, instead of engineering plastic.

As described above, a tapped hole 44A is located on an upper surface of said one end of the socket 44 so that the tapped hole 44A can be viewed through the opening 43A of the electrode plate 36, while the sockets 44 are attached to the grooves 43 (receptacle parts) of the electrode plate 36. In other words, the upper electrode 23 in accordance with the first preferred embodiment of the present invention is configured such that the tapped holes 44A are additionally provided on the electrode plate 36 by attaching the sockets 44 having the tapped holes 44A formed thereon to the electrode plate 36.

When the electrode plate 36 is mounted to the cooling plate 35, the tapped holes 44A of the sockets 44 accommodated in the openings 43A of the electrode plate 36 coincide with the through-holes 35B of the cooling plate 35 if viewed from a plane figure thereof. Moreover, while bringing the upper surface of the electrode plate 36 into contact with the lower surface of the cooling plate 35, the screws 42 (the fastening unit) are inserted into the through-holes 35B from the side of the upper surface of the cooling plate 35. By driving the screws 42 into the tapped holes 44A of the sockets 44, the cooling plate 35 and the electrode plate 36 can be jointed.

As described above, since the sockets 44 are attached to the electrode plate 36 such that the tapped holes 44A are opened toward a side of the upper surface of the electrode plate 36 and since the screws 42 are located at a region which is not exposed to the processing space (the plasma space), the screws 42 (the fastening unit) can be isolated from the plasma space. Furthermore, by directly hitching the flanges 44B of the sockets 44 to the step-attached part 43C of the electrode plate 36, the electrode plate 36 is firmly supported by the cooling plate 35.

A second preferred embodiment of the present invention will now be described with reference to FIGS. 5A-7B. Same reference numerals are used in the second preferred embodiment as in the first preferred embodiment if they have same functions as those of the first preferred embodiment.

Figure 5A:
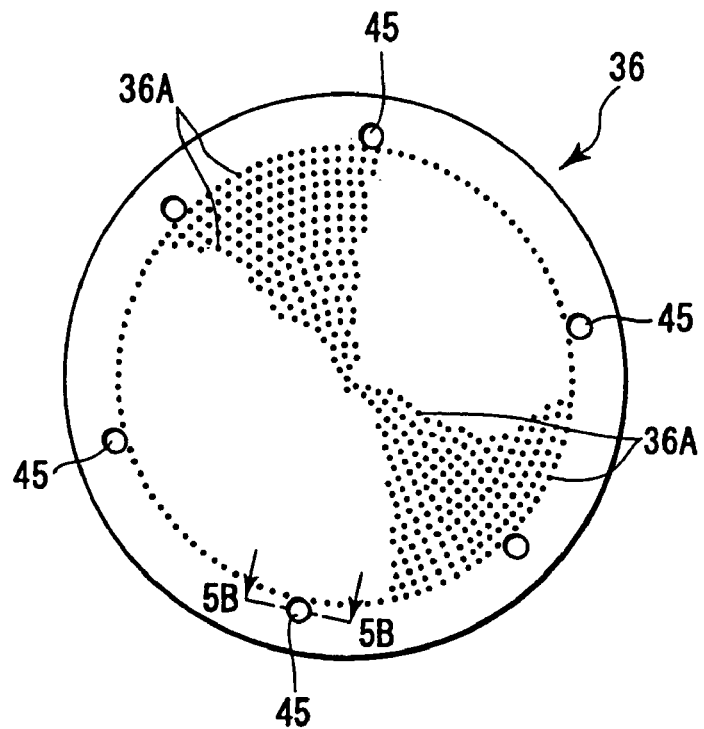
FIG. 5A is a plan view of an electrode plate in accordance with a second preferred embodiment of the present invention.
Figure 5B:
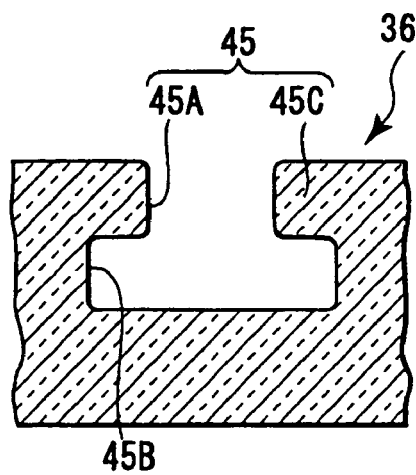
FIG. 5B is a sectional view taken along the line 5B-5B of FIG. 5A.
Figure 6A:
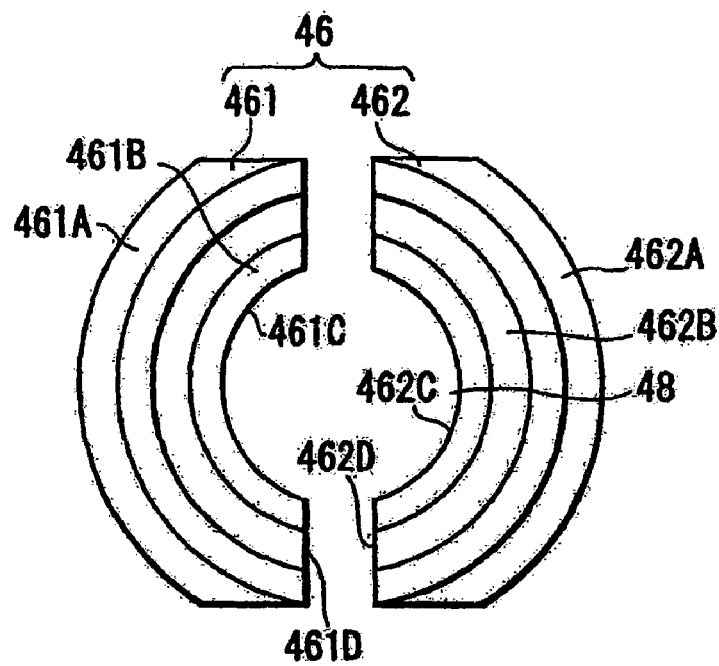
FIG. 6A is a plan view of a holder installed in a receptacle part of the electrode plate of FIG. 5.
Figure 6B:
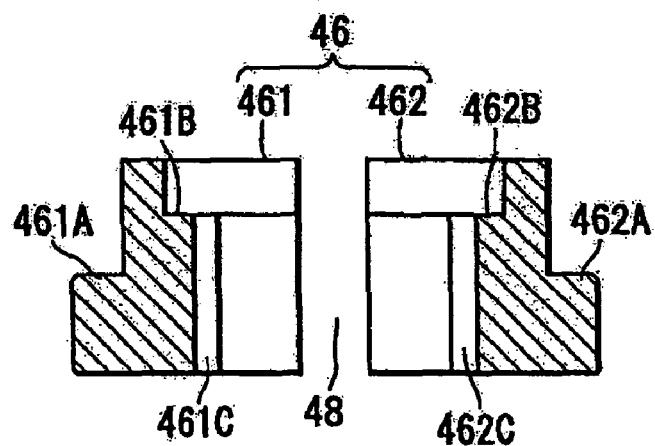
FIG. 6B is a cross sectional view of the holder of FIG. 6A.
Figure 7A:
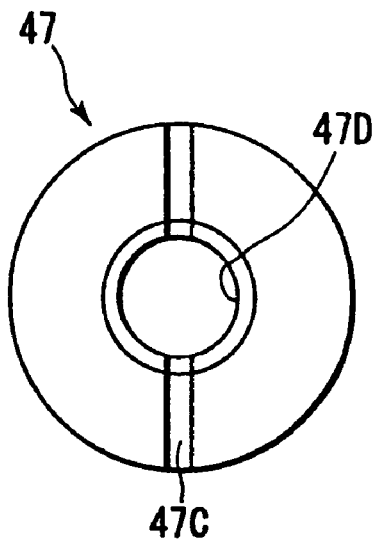
FIG. 7A is a plan view of a socket installed in the holder of FIG. 6.
Figure 7B:
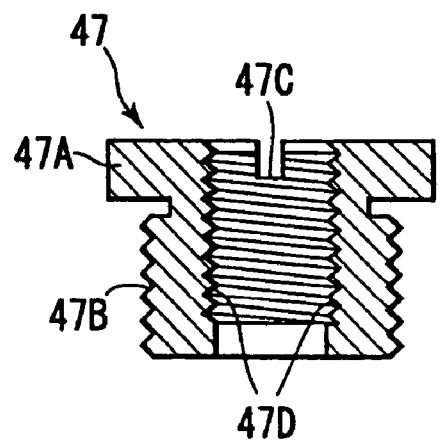
FIG. 7B is a cross sectional view of the socket of FIG. 7A.
Figure 10:
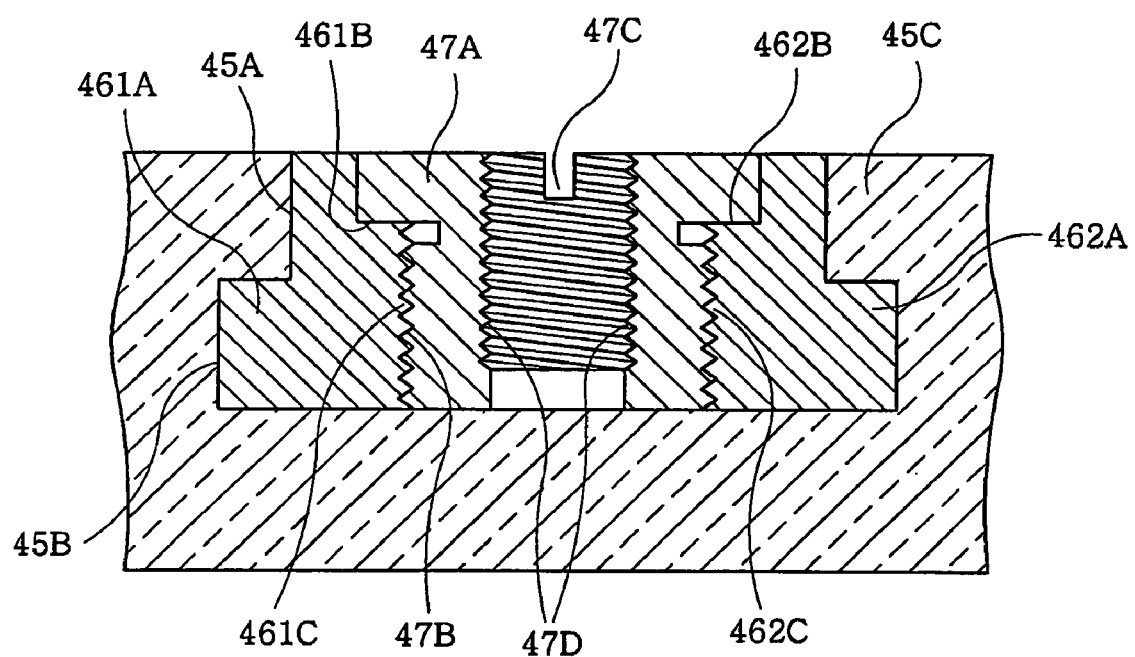
FIG. 10 is a cross sectional view of the receptacle part after the holder shown in FIGS. 6A and 6B and the socket shown in FIGS. 7A and 7B are installed in the receptacle part shown in FIGS. 5A and 5B.

Similar to the electrode plate 36 of the first preferred embodiment as shown in FIGS. 3A and 3B, an electrode plate 36 in accordance with the second preferred embodiment, having a disk shape, is made of, e.g., quartz, and has a plurality of gas injection holes 36A for supplying the processing gas into the processing vessel 11. As shown in FIGS. 5A and 5B, a plurality of holes 45, with a nearly circular shape if viewed from a plane figure thereof, are formed around a peripheral portion of the electrode plate 36. As shown in FIG. 5B, each of the holes 45 includes a circular-shaped opening 45A and a breadth enlarged part 45B having a wider breadth in radial directions (an elliptic shape) than that of the opening 45A. A step-attached part 45C is formed at a boundary portion between the opening 45A and the breadth enlarged part 45B. Both a holder 46 shown in FIGS. 6A and 6B and a socket 47 shown in FIGS. 7A and 7B are installed in each of the holes 45 as shown in FIG. 10. That is, the holes 45 serve as receptacle parts for supporting the sockets 47.

The holder 46 is made of, e.g., engineering plastic, desirably, polybenzimidazole, such as, e.g., Cerazole (a product name). As shown in FIGS. 6A and 6B, the holder 46 includes a first member 461 and a second member 462. The first and second members 461 and 462, having a shape of circular arc if viewed from a plane figure thereof, are disposed symmetrically. Flanges 461A, 462A are formed on an outer peripheral portion of the first and second members 461 and 462, respectively. Step-attached parts 461B, 462B and coupling parts 461C, 462C composed of nuts are formed on an inner peripheral portion of the first and second members 461 and 462, respectively. The holder 46 is inserted into the hole 45 of the electrode plate 36, while the cross section 461D of the first member 461 faces the cross section 462D of the second member 462. Thereafter, the socket 47 shown in FIGS. 7A and 7B is inserted into a spatial part 48 which is surrounded by the first and second members 461 and 462.

Figure 8A:
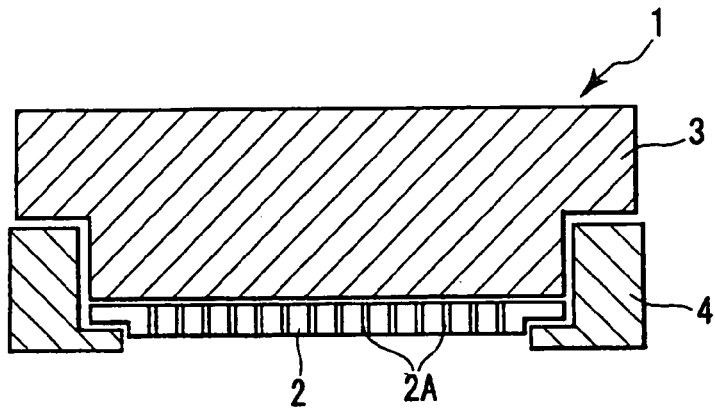
FIG. 8A is a cross sectional view showing a configuration of a conventional upper electrode.
Figure 8B:
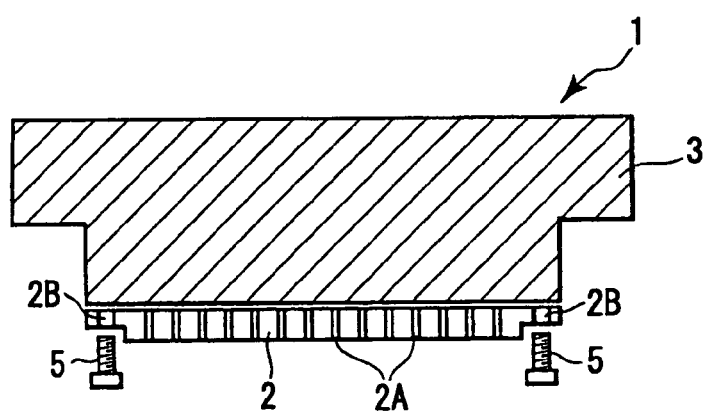
FIG. 8B is a cross sectional view showing a configuration of an electrode plate mounted to a supporting member in the conventional upper electrode.
Figure 8C:
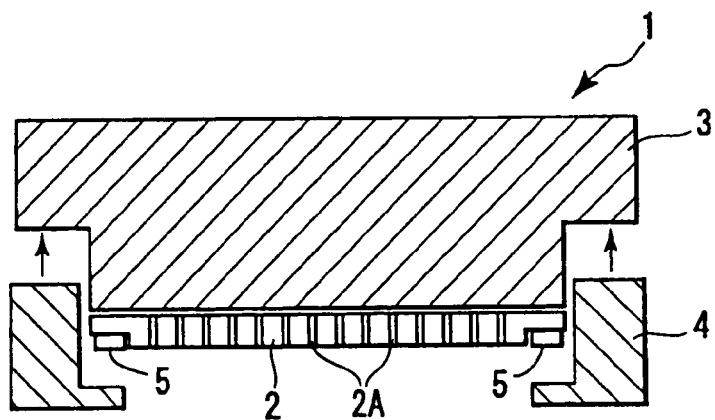
FIG. 8C is a cross sectional view showing a configuration process of a shield ring being mounted in the conventional upper electrode.

The socket 47 is formed into a single body, made of the same material as that of the holder 46, e.g., engineering plastic, desirably, polybenzimidazole, such as Cerazole (a product name). As shown in FIGS. 7A and 8B, the socket 47, including both a flange 47A and a screw part 47B, has a nearly cylindrical shape. The screw part 47B is screwed into a tapped hole surrounded by the coupling parts 461C and 462C.

By inserting the socket 47 into the spatial part 48 (the tapped hole) and by binding a jig, such as a screwdriver, into a groove 47C of the socket 47 to impose a rotating force in an axial direction, the holder 46 (the first and second members 461 and 462) becomes fixed after it is adjusted in a breadth direction in the hole 45. And, if the screw part 47B of the socket 47 is coupled with (screwed into) the tapped hole surrounded by the coupling parts 461C and 462C, the flange 47A comes into contact with the step-attached parts 461B and 462B, thereby fixing the holder 46 and the socket 47 to the electrode plate 36.

As described above, the socket 47 is indirectly accommodated in the hole 45 (the receptacle part) of the electrode plate 36 through the holder 47. The holder 46 and the socket 47 can be made of aluminum, stainless steel or the like, instead of engineering plastic.

Meanwhile, because a tapped hole 47D is located in a center portion of the socket 47, the tapped holes 47D can be viewed from the upper surface of the electrode plate 36 (from the side of the cooling plate 35) while the holders 46 and the sockets 47 are inserted into the holes 45 of the electrode plate 36.

The through-holes 35B formed on the cooling plate 35 correspond to the holes 45 of the electrode plate 36 (the tapped holes 47D of the sockets 47) if viewed from a plane figure thereof. While the upper surface of the electrode plate 36, having the holders 46 and the sockets 47 inserted thereinto, comes in contact with the lower surface of the cooling plate 35, a fastening member (a screw) is inserted into the through-holes 35B from the upper surface of the cooling plate 35 (the side on which the cooling plate 35 is mounted). The fastening member is tightened into the tapped holes 47D, thereby jointing the cooling plate 35 and the electrode plate 36.

By coupling the flanges 461A and 462A of the holder 46 with the step-attached part 45C of the electrode plate 36, i.e., by indirectly coupling the socket 47 with the step-attached part 45C, the electrode plate 36 can be firmly supported by the cooling plate 35.

As described above, in accordance with the first and the second preferred embodiments, by forming the receptacle parts 43, 45 for accommodating the sockets 44, 47 on the electrode plate 36, and by accommodating the sockets 44, 47 having tapped holes 44A, 47D in the receptacle parts 43, 45, the tapped hole can be additionally disposed on the electrode plate 36 without directly forming the tapped hole on the electrode plate 36. Since the screws are inserted from the side of the supporting member (opposite side of the plasma space), the screws are not exposed to the plasma space. Thus, no additional member for shielding the screws (shield ring) is required, and no surface irregularties are required in the processing vessel by simplifying a complicated shape.

Consequently, the manufacturing costs are reduced and at the same time, the effective gas hole diameter can be increased by forming the gas injection holes at the peripheral portion of the electrode plate.

It should be noted that, in accordance with each of the above-mentioned embodiments, the configuration of accommodating the sockets 44, 47 in the receptacle parts after forming thin- and long-shaped grooves 43 or circular-shaped holes 45 on the electrode plate 36 serving as the receptacle parts, are explained, but the shape and the number of the receptacle parts, the shape and the construction of the sockets and the like are not confined to the above-mentioned embodiments if the sockets having the tapped holes are opened toward the side where the supporting member (the cooling plate) is mounted.

Furthermore, in accordance with each of the above-mentioned embodiments, the upper electrode, having a laminated structure of the upper member, the supporting member (the cooling plate) and the electrode plate, has been described, but the upper member and the supporting member can be integrated into a single body.

Moreover, in accordance with each of the above-mentioned embodiments, the configuration of the lower electrode for supporting the substrate and the electrode plate (the upper electrode) facing the lower electrode, arranged in a vertical direction in parallel, has been described, but the present invention can be applied to a processor in which, for example, the two electrodes are placed apart in a horizontal direction. Furthermore, the plasma processor, in which the high frequency power is applied to both the upper electrode and the lower electrode, respectively, has been described, but the present invention can be adapted to a plasma processor in which the high frequency power is applied to one of the electrodes (for example, the lower electrode).

Furthermore, in accordance with each of the above-mentioned embodiments, the parallel plate-type plasma etching processor has been explained, but the present invention can be applied to various types of plasma processors, e.g., magnetron-type, inductive coupling-type and the like. In addition, the present invention can be adapted to a variety of plasma processors, such as an ashing processor, a film forming processor, or the like, as well as the etching processor. Furthermore, the present invention can be adapted to a device for processing a glass substrate for LCD.

While the invention has been shown and described with respect to the preferred embodiments, it will be understood by those skilled in the art that various changes and modifications may be made without departing from the spirit and scope of the invention as defined in the following claims.

What is claimed is:

1. A plasma processor electrode comprising:
   a supporting member arranged to face a supporting electrode for supporting a substrate to be processed;
   an electrode plate, mounted to the supporting member, for providing a processing gas through a plurality of gas injection holes into a processing space formed between the electrode plate and the supporting electrode, thereby generating a plasma in the processing space, the electrode plate including the gas injection holes and one or more receptacle parts opened toward the supporting member; and
   fastening means for combining the electrode plate with the supporting member by screwing into a tapped hole provided in each receptacle part of the electrode plate from a side of the supporting member,
   wherein each receptacle part does not include an opening on a surface of said electrode plate opposite to a surface facing said supporting member,
   wherein each receptacle part includes an opening that opens toward the supporting member, and wherein a socket that includes the tapped hole is accommodated in each receptacle part such that the tapped hole opens toward the opening, and
   wherein a holder including two members is provided within each receptacle part, and the two members form a receptacle space in which the socket is accommodated.

2. The plasma processor electrode of claim 1, wherein each receptacle part is provided with a step-attached part which is directly or indirectly coupled with the socket.

3. The plasma processor electrode of claim 1, wherein each receptacle part is formed on a peripheral portion of the electrode plate and is a long groove which is opened toward a circumferential surface of the electrode plate.

4. The plasma processor electrode of claim 3, wherein the socket is inserted into and removed from the long groove in a longitudinal direction.

5. The plasma processor electrode of claim 1, wherein each receptacle part is approximately of a circular hole which is formed on a peripheral portion of the electrode plate.

6. The plasma processor electrode of claim 1, wherein the socket with the tapped hole that opens toward the opening is accommodated in each receptacle part through the holder.

7. The plasma processor electrode of claim 6, wherein each receptacle part is provided with a step-attached part which is coupled with the holder.

8. The plasma processor electrode of claim 1, wherein the two members forming the holder include screw parts, with the socket being combined with a surface of the screw parts forming the receptacle space.

9. The plasma processor electrode of claim 8, wherein the two members forming the holder are integrated and the holder is accommodated in each receptacle part by screwing the socket into the screw parts.

10. A plasma processor comprising:

a plasma processor electrode including
- a supporting member arranged to face a supporting electrode for supporting a substrate to be processed;
- an electrode plate, mounted to the supporting member, for providing a processing gas through a plurality of gas injection holes into a processing space formed between the electrode plate and the supporting electrode, thereby generating a plasma in the processing space, the electrode plate including the gas injection holes and one or more receptacle parts opened toward the supporting member; and
- fastening means for combining the electrode plate with the supporting member by screwing into a tapped hole provided in each receptacle part of the electrode plate from a side of the supporting member,
- wherein each receptacle part does not include an opening on a surface of said electrode plate opposite to a surface facing said supporting member,
- wherein each receptacle part includes an opening that opens toward the supporting member, and wherein a socket that includes the tapped hole is accommodated in each receptacle part such that the tapped hole opens toward the opening,
- wherein a holder including two members is provided within each receptacle part, and the two members form a receptacle space in which the socket is accommodated.

11. The plasma processor of claim 10, wherein the electrode plate is so placed as to be spaced apart from the supporting electrode for supporting the substrate to be processed in a vertical direction.

12. The plasma processor electrode of claim 1, wherein the electrode plate is mounted to a lower surface of the supporting member, the electrode plate is placed above the supporting electrode, and each receptacle part is disposed in an upper portion of the electrode plate.

13. A plasma processor electrode comprising:

a supporting member configured to face a substrate to be processed, said supporting member having a through-hole extending therethrough;

an electrode plate having a plurality of gas injection holes extending therethrough, said electrode plate being mounted to said supporting member and configured to be provided between said supporting member and the substrate to be processed, said electrode plate having a receptacle on a surface facing said supporting member; and a fastener extending through said through-hole of said supporting member and extending within said receptacle to join said electrode plate with said supporting member, wherein said receptacle does not include an opening on a surface of said electrode plate opposite to said surface facing said supporting member, wherein a socket that includes a tapped hole is provided within said receptacle, and wherein said fastener is a screw engaged with said tapped hole of said socket, wherein a holder including two members is provided within said receptacle, and wherein said two members define a receptacle space therebetween in which said socket is accommodated.

14. The plasma processor electrode of claim 13, wherein said receptacle is a groove that is opened toward a circumferential surface of said electrode plate, and wherein said socket is slidably inserted within said groove.

15. The plasma processor electrode of claim 1, wherein each receptacle part includes a breadth enlarged part that is disposed within the electrode plate below the opening that opens toward the supporting member, and wherein the breadth enlarged part is wider than the opening.

16. The plasma processor electrode of claim 1, wherein each receptacle part includes a stepped profile defined by the opening and a breadth enlarged part that is disposed below the opening.

17. The plasma processor electrode of claim 16, wherein each of the two members of the holder include a flange portion that engages with the breadth enlarged part of the receptacle part in which each holder is respectively disposed.

18. The plasma processor electrode of claim 13, wherein each receptacle includes a breadth enlarged part that is disposed within the electrode plate below the opening on the surface of the electrode plate, and wherein the breadth enlarged part is wider than the opening.

19. The plasma processor electrode of claim 13, wherein each receptacle includes a stepped profile defined by the opening and a breadth enlarged part that is disposed below the opening.

20. The plasma processor electrode of claim 19, wherein each of the two members of the holder include a flange portion that engages with the breadth enlarged part of the receptacle in which each holder is respectively disposed.

* * * * *